United States Patent
Ueda et al.

(10) Patent No.: US 8,063,718 B2
(45) Date of Patent: Nov. 22, 2011

(54) DUPLEXER, COMMUNICATION MODULE, AND COMMUNICATION DEVICE

(75) Inventors: Masanori Ueda, Kawasaki (JP); Shogo Inoue, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 12/686,303

(22) Filed: Jan. 12, 2010

(65) Prior Publication Data

US 2010/0109800 A1   May 6, 2010

Related U.S. Application Data

(63) Continuation of application No. PCT/JP2007/066391, filed on Aug. 23, 2007.

(51) Int. Cl.
*H03H 9/70* (2006.01)
*H03H 9/72* (2006.01)

(52) U.S. Cl. ............... 333/133; 333/126; 333/129

(58) Field of Classification Search ............ 333/126, 333/129, 132, 133
See application file for complete search history.

(56) References Cited

U.S. PATENT DOCUMENTS

| 5,568,002 | A | 10/1996 | Kawakatsu et al. |
|---|---|---|---|
| 5,790,000 | A * | 8/1998 | Dai et al. ............ 333/193 |
| 6,262,637 | B1 | 7/2001 | Bradley et al. |
| 6,535,080 | B2 * | 3/2003 | Taniguchi ............ 333/193 |
| 6,714,099 | B2 * | 3/2004 | Hikita et al. ......... 333/133 |
| 6,803,835 | B2 * | 10/2004 | Frank ............... 333/26 |
| 7,102,460 | B2 * | 9/2006 | Schmidhammer et al. ... 333/133 |
| 7,194,247 | B2 * | 3/2007 | Tikka et al. .......... 455/339 |
| 7,224,245 | B2 * | 5/2007 | Song et al. .......... 333/133 |
| 7,479,846 | B2 * | 1/2009 | Inoue et al. ......... 333/133 |
| 7,629,863 | B2 * | 12/2009 | Iwamoto et al. ...... 333/133 |
| 2003/0042992 | A1 | 3/2003 | Frank |
| 2003/0112768 | A1 * | 6/2003 | Frank ............... 370/281 |
| 2003/0128081 | A1 * | 7/2003 | Ella et al. .......... 333/133 |
| 2003/0214369 | A1 | 11/2003 | Kearns |
| 2004/0140868 | A1 | 7/2004 | Takeuchi et al. |
| 2005/0151600 | A1 | 7/2005 | Takeuchi et al. |
| 2006/0028298 | A1 | 2/2006 | Nakamura et al. |
| 2006/0061435 | A1 | 3/2006 | Sul |
| 2006/0066419 | A1 * | 3/2006 | Iwaki et al. ......... 333/133 |
| 2006/0132260 | A1 * | 6/2006 | Iwamoto et al. ...... 333/133 |

(Continued)

FOREIGN PATENT DOCUMENTS

EP   1 058 383 A2   12/2000

(Continued)

*Primary Examiner* — Barbara Summons
(74) *Attorney, Agent, or Firm* — Arent Fox LLP

(57) ABSTRACT

A duplexer of the present invention includes a reception filter (3) for passing signals in a predetermined frequency band and attenuates signals in the other frequency bands among reception signals input to an antenna port, and a transmission filter (4) for passing signals in a predetermined frequency band and attenuates signals in the other frequency bands among transmission signals input from the outside and outputting them to the antenna port. The duplexer further includes a conversion circuit (22) provided with a single-ended input terminal connected to the antenna port and balanced output terminals. The reception filter (3) is provided with a balanced input terminal connected to the output terminal of the conversion circuit (22) and a balanced output terminal for outputting the filtered reception signal. Thus, a balance-output-type duplexer that is connectable to a balance-input-type LNA and is free from loss and degradation in power-handling capability, a communication module and a communication device can be realized.

14 Claims, 16 Drawing Sheets

U.S. PATENT DOCUMENTS

2009/0002096 A1   1/2009  Nakamura et al.

FOREIGN PATENT DOCUMENTS

| JP | 6-204781 A | | 7/1994 |
|---|---|---|---|
| JP | 11-346142 | * | 12/1999 |
| JP | 2000-114917 | * | 4/2000 |
| JP | 2001-024476 A | | 1/2001 |
| JP | 2003-209484 A | | 7/2003 |
| JP | 2003-338723 A | | 11/2003 |
| JP | 2003-347889 A | | 12/2003 |
| JP | 2003-347964 A | | 12/2003 |
| JP | 2006-074749 A | | 3/2006 |
| JP | 2006-094457 A | | 4/2006 |

* cited by examiner

_US 8,063,718 B2_

DUPLEXER, COMMUNICATION MODULE, AND COMMUNICATION DEVICE

CROSS-REFERENCE TO RELATED APPLICATIONS

This application is based upon and claims the benefit of priority of International Patent Application No. PCT/JP 2007/066391 filed on Aug. 23, 2007, the entire contents of which are incorporated herein by reference.

FIELD

The present application relates to a duplexer, a communication module, and a communication device.

BACKGROUND

By combining plural resonators using surface acoustic waves (SAW) or bulk acoustic waves (BAW) using piezoelectric materials, a filter element for high-frequency communication has been developed and put into practical use, which is characterized by passing only electrical signals in a specific frequency band. Further, in recent years, a boundary wave filter that mainly propagates along the boundary between a piezoelectric substrate and a medium formed thereon also has been developed. Such filter components using SAW or BAW have a small profile compared with other dielectric filters or ceramic filters and have steep roll-off characteristics. Therefore, such filters are suited to mobile communication components such as mobile phones that are required to be compact and to have a narrow bandwidth ratio.

A duplexer is a component that applies SAW or BAW filters thereto. A duplexer has transmitting/receiving functions, and is used in a wireless device in which a transmission signal frequency and a reception signal frequency are different from each other. An exemplary filter configuration using such SAW or BAW filters includes a ladder filter in which filters are connected in series-parallel in a ladder configuration. The ladder filter is low loss and has a superior power-handling performance, and hence is widely used in the duplexer. JP 2001-24476 A discloses a ladder filter that is formed by connecting FBARs (Film Bulk Acoustic Resonators) in a ladder configuration, which function similarly to the SAW filter and the like.

The input/output terminals of duplexers have, to date, been limited to single-ended terminals in most cases (see Patent Document 1). However, the future trend in a RF architecture is that an LNA (Low Noise Amplifier) connected downstream of the reception filter tends to be compatible with balanced input. This necessitates the output terminal of the reception filter of a duplexer connected to the LNA input terminal to be compatible with balanced output.

SUMMARY

A duplexer according to the present invention includes a single antenna port, a reception filter that passes a signal in a reception frequency band and attenuates a signal in a transmission frequency band among signals input to the antenna port, and a transmission filter that passes a signal in a transmission frequency band and attenuates a signal in a reception frequency band among signals input from an outside and outputs the filtered signal to the antenna port, and the duplexer further includes a first conversion circuit provided with a single input terminal connected to the antenna port and balanced output terminals, wherein the reception filter includes balanced input terminals connected to the output terminals of the first conversion circuit and balanced output terminals for outputting filtered reception signals.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Figure 1:
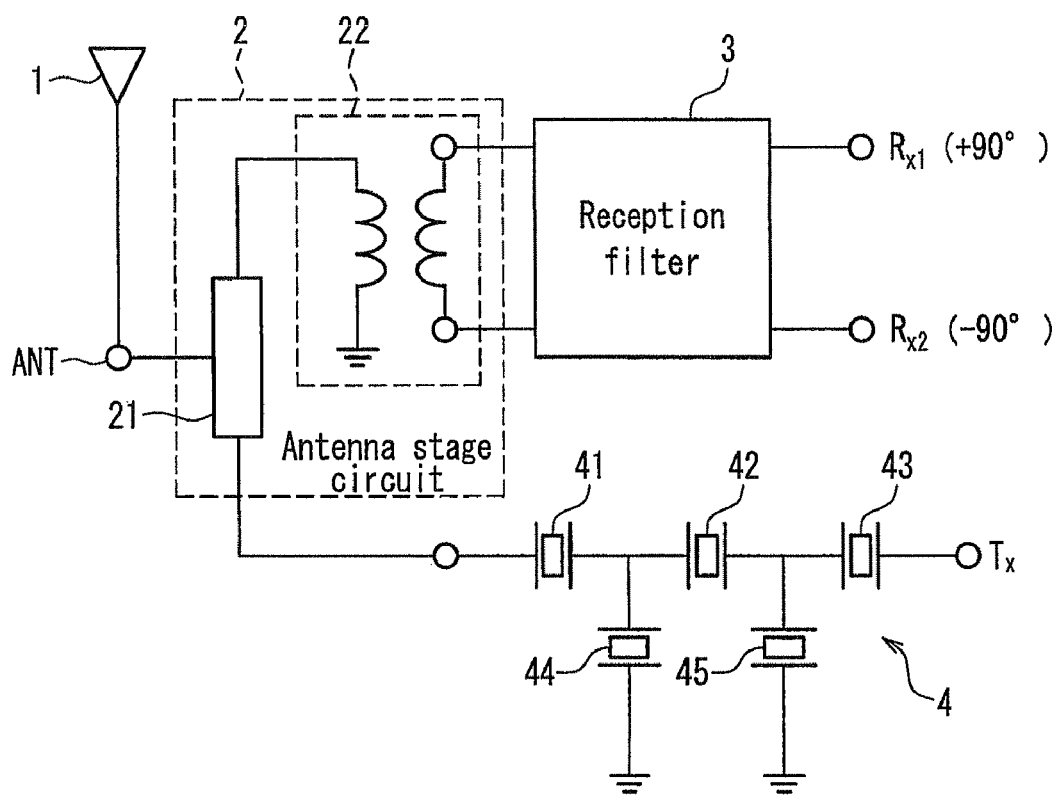
FIG. 1 is a block diagram illustrating a configuration of a duplexer according to Embodiment 1.

The duplexer of the present invention includes a single antenna port, a reception filter that passes a signal in a reception frequency band and attenuates a signal in a transmission frequency band among signals input to the antenna port, a transmission filter that passes a signal in a transmission frequency band and attenuates a signal in a reception frequency band among signals input from outside and outputs the filtered signal to the antenna port, and the duplexer further includes a first conversion circuit provided with a single input terminal connected to the antenna port and balanced output terminals, wherein the reception filter includes balanced input terminals connected to the output terminals of the first conversion circuit and balanced output terminals for outputting filtered reception signals. With such a configuration in which a single signal input to the antenna port is converted into balanced signals and the balanced signals are output from balanced output terminals of the reception filter, it is possible to obtain a configuration connectable to a balance-input-type LNA.

Based on the configuration described above, the duplexer of the present application can assume the following various aspects.

That is, the duplexer of the present application can further include a phase matching circuit for performing phase matching between the reception filter and the transmission filter. With this configuration, it is possible to prevent transmission signals output from the transmission filter from flowing into the reception filter side.

Further, the first conversion circuit can have a function of performing phase matching between the reception filter and the transmission filter. With this configuration, it is possible to prevent transmission signals output from the transmission filter from flowing into the reception filter side.

Further, the reception filter can be formed of a double-mode surface acoustic wave filter. With this configuration, it is possible to obtain a configuration connectable to a balance-input-type LNA disposed downstream of the reception filter.

Further, at least a part of the reception filter can be formed of a balanced ladder filter. With this configuration, it is possible to obtain a configuration connectable to a balance-input-type LNA disposed downstream of the reception filter. Further, it also is possible to realize a reception filter with a low loss and a superior power-handling capability.

Still further, the reception filter can be formed of two single-ended ladder filters. With this configuration, it is possible to realize a reception filter with a low loss and a superior power-handling capability, and to obtain a configuration connectable to a balance-input-type LNA disposed downstream of the reception filter.

Still further, at least a part of the reception filter can be formed of a balanced lattice filter. With this configuration, it is possible to obtain a configuration connectable to a balance-input-type LNA disposed downstream of the reception filter. Moreover it is possible to realize a reception filter with a low loss and a superior power-handling capability, and further a reception filter with gentle cut-off characteristics.

Still further, the transmission filter can be formed of a single-ended filter. With this configuration, it is possible to realize a transmission filter with a compact circuit size.

Still further, the transmission filter can be formed of a balanced filter, and the duplexer further includes balanced input terminals connected to the transmission filter, a single output terminal connected to the antenna port, and a second conversion circuit for converting balanced signals input to the balanced input terminals into a single signal. With this configuration, it is possible to obtain a configuration connectable to a balance-output-type power amplifier disposed upstream of the transmission filter.

Still further, the transmission filter can be formed of a ladder filter. With this configuration, it is possible to obtain a configuration connectable to a balance-output-type power amplifier disposed upstream of the transmission filter. Further, it is possible to realize a transmission filter with a low loss and a superior power-handling capability.

Still further, the transmission filter can be formed of a double-mode surface acoustic wave filter. With this configuration, it is possible to obtain a configuration connectable to a balance-output-type power amplifier disposed upstream of the transmission filter.

Still further, the first conversion circuit and the phase matching circuit can be formed on the same substrate. With this configuration, the first conversion circuit and the phase matching circuit can be produced at the same time, whereby the manufacturing process becomes easier and the production cost thereof can be reduced. Further, a chip provided with the circuits can be made compact.

Still further, the first conversion circuit and the phase matching circuit can be formed of lumped constant elements. With this configuration, it is possible to realize the circuits easily at low cost.

Still further, each of the first conversion circuit and the phase matching circuit can be formed partially or entirely on a substrate of a transmission filter element or a reception filter element. With this configuration, at the time of manufacturing the filter, a part or the entirety of the first conversion circuit and the phase matching circuit can be formed at the same time, whereby the manufacturing process becomes easier and the production cost can be reduced. Further, a chip provided with the circuits can be made compact.

Still further, the reception filter or the transmission filter includes a plurality of filter elements, and the filter elements can be composed of any one of a surface acoustic wave filter, a boundary wave filter, or a film bulk acoustic resonator filter. When the reception filter or the transmission filter is formed of the surface acoustic wave filter, the reception filter or the transmission filter can be made compact. Moreover, since the surface acoustic wave filter has steep roll-off characteristics, it is suited to mobile communication components such as mobile phone terminals that are required to have a narrow bandwidth ratio. When the reception filter or the transmission filter is formed of the boundary wave filter; the reception filter or the transmission filter can be made compact, and packing for airtight sealing becomes unnecessary. Further; when the reception filter or the transmission filter is formed of the film bulk acoustic resonator filter, the filter can be produced easily using the semiconductor technology.

Embodiment 1

FIG. 1 illustrates a configuration of a duplexer according to Embodiment 1. The duplexer includes an antenna 1, an antenna stage circuit 2, a reception filter 3, and a transmission filter 4.

The antenna stage circuit 2 is connected to the antenna 1 via a single-ended antenna terminal ANT, and includes a phase matching circuit 21 and a conversion circuit 22 (first conversion circuit). The phase matching circuit 21 is an element for adjusting the impedance phase of the reception filter 3 to prevent transmission signals output from the transmission filter 4 from flowing into the reception filter 3 side. The conversion circuit 22 is connected between the reception filter 3 and the antenna terminal ANT or the phase matching circuit 21 (the phase matching circuit 21 in this embodiment), and is an element for converting a single signal (reception signal) output from the phase matching circuit 21 into balanced signals, and outputting them from the circuit. Therefore, an input terminal of the conversion circuit 22 is a single terminal, which is a single system; and an output terminal thereof is balanced terminals, which is a dual system.

Figure 2:
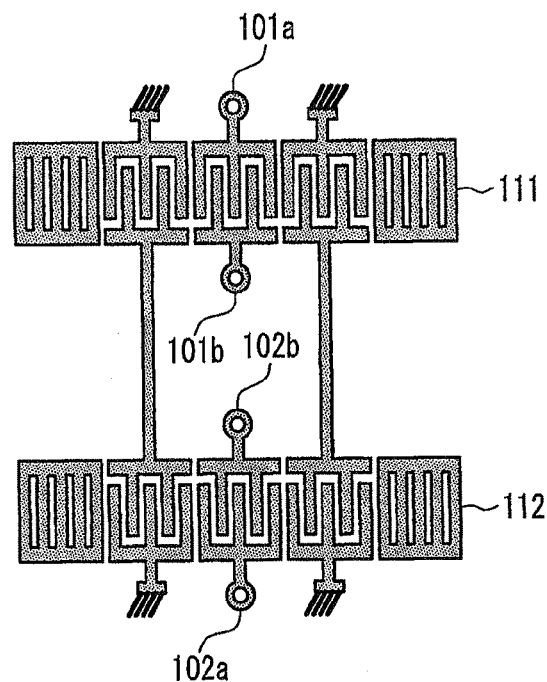
FIG. 2 is a circuit diagram illustrating a configuration of a DMS filter.

The reception filter 3 is a band-pass filter that passes a predetermined frequency band and attenuates bands other than the predetermined frequency band among reception signals input therein. Both the input and output terminals of the reception filter are balanced terminals. Moreover, the reception filter 3 is formed of a DMS (Double Mode SAW) filter as illustrated in FIG. 2. The DMS filter is formed by connecting a first SAW filter 111 and a second SAW filter 112. A terminal 101a is connected to one of output terminals of the conversion circuit 22 and a terminal 101b is connected to the other output terminal of the conversion circuit 22; and a terminal 102a is connected to a reception terminal Rx1 and a terminal 102b is connected to a reception terminal Rx2.

The transmission filter 4 is a band-pass filter that passes a predetermined frequency band and attenuates bands other than the predetermined frequency band among transmission signals input therein. The specific configuration of the transmission filter 4 is, as illustrated in the figure, formed of a single-ended ladder filter in which a plurality of SAW filters 41 to 45 are connected with each other in a ladder configuration. Since the transmission filter 4 of the present embodiment is formed of the single-ended filter, a circuit thereof can be realized in a compact size. The SAW filters 41, 42 and 43 connected serially with each other are connected to the phase matching circuit 21 and the transmission terminal Tx. The SAW filter 44 is connected to a node between the SAW filters 41 and 42. The SAW filter 45 is connected to a node between the SAW filters 42 and 43.

In the present embodiment, the reception filter 3 and the transmission filter 4 are configured so that the high-frequency stopband of the transmission filter 4 overlaps the passband of the reception filter 3, and the low-frequency stopband of the reception filter 3 overlaps the passband of the transmission filter 4.

The operation will be described below.

First, a receiving operation will be described. A reception signal (single signal) input from the antenna 1 is input to the conversion circuit 22 via the phase matching circuit 21. The conversion circuit 22 converts the input single signal into balanced signals and outputs them from the circuit.

The signals output from the conversion circuit 22 are input to the reception filter 3. The reception filter 3 passes limited reception signals in a predetermined frequency band by passing the input reception signals through the first SAW filter 111 and the second SAW filter 112 illustrated in FIG. 2. At this time, a phase of one of balanced signals output from the reception filter 3 is advanced by 90 degrees; and a phase of the other balanced signal is delayed by 90 degrees. The reception signals output from the reception filter 3 are output from the reception terminals Rx1 and Rx2, and thereafter input to an LNA (not illustrated) that is compatible with balanced input.

Next, a transmitting operation will be described. A transmission signal output from a single-output power amplifier (not illustrated) arranged in a transmission system is input to the transmission filter 4 via the transmission terminal Tx. The transmission filter 4 outputs a transmission signal limited in a predetermined frequency band by passing the input transmission signal through the SAW filters 41 to 45. The transmission signal output from the transmission filter 4 is then output to the antenna 1 via the phase matching circuit 21.

As described above, according to the present embodiment, it is possible to realize a duplexer that is connectable to a balance-input-type LNA connected downstream of the reception filter 3 as a result of including the conversion circuit 22 that converts a single signal input via the single-ended antenna terminal ANT into balanced signals as well as the reception filter 3 provided with balanced input terminals and balanced output terminals.

Figure 3:
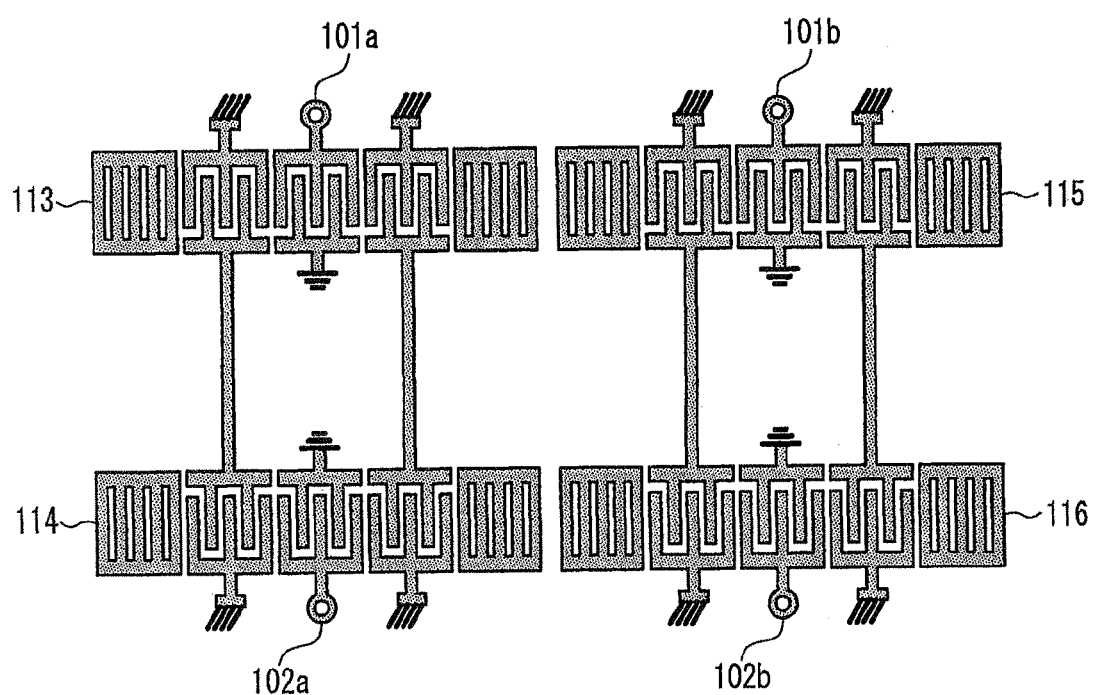
FIG. 3 is a circuit diagram illustrating a configuration of a DMS filter.

In the present embodiment, the reception filter 3 is formed of two SAW filters 111 and 112 as illustrated in FIG. 2, but the filter can be formed of four SAW filters 113 to 116 as illustrated in FIG. 3. The DMS filter configured as illustrated in FIG. 3 does not have much differences in properties compared with the DMS filter illustrated in FIG. 2.

Embodiment 2

Embodiment 2 is characterized by a configuration in which the reception filter 3 is formed of a ladder filter provided with balanced input terminals and balanced output terminals (hereinafter, referred to as a balanced ladder filter).

Figure 4:
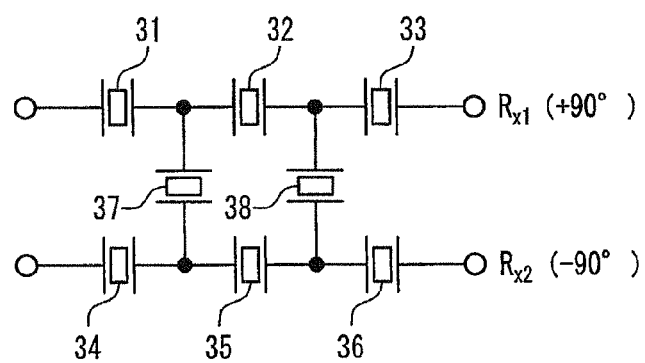
FIG. 4 is a circuit diagram illustrating a configuration of a ladder filter.

As illustrated in FIG. 4, the balanced ladder filter includes a plurality of SAW filters 31 to 38 connected to each other in a ladder configuration. The SAW filters 31, 32 and 33 are connected serially to each other, and connected to a reception terminal Rx1 and one of output terminals of the conversion circuit 22. The SAW filters 34, 35 and 36 are connected serially to each other, and connected to a reception terminal Rx2 and the other output terminal of the conversion circuit 22. Further, the SAW filter 37 is connected between a node of the SAW filters 31 and 32, and a node of the SAW filters 34 and 35. The SAW filter 38 is connected between a node of the SAW filters 32 and 33, and a node of the SAW filters 35 and 36.

Figure 5A:
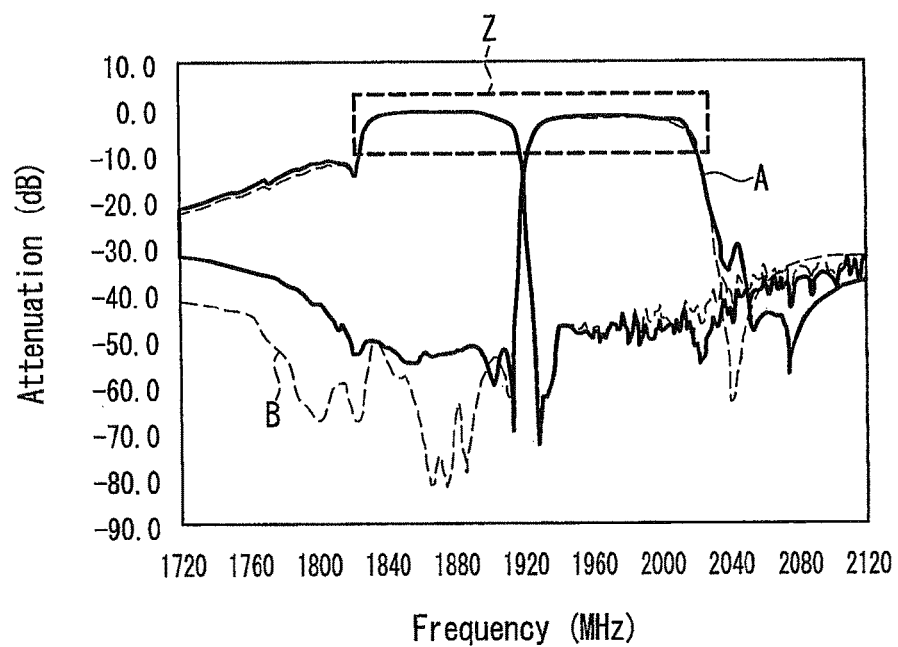
FIG. 5A is a characteristic diagram illustrating frequency characteristics of a reception signal and a transmission signal generated by a duplexer according to Embodiment 2.
Figure 5B:
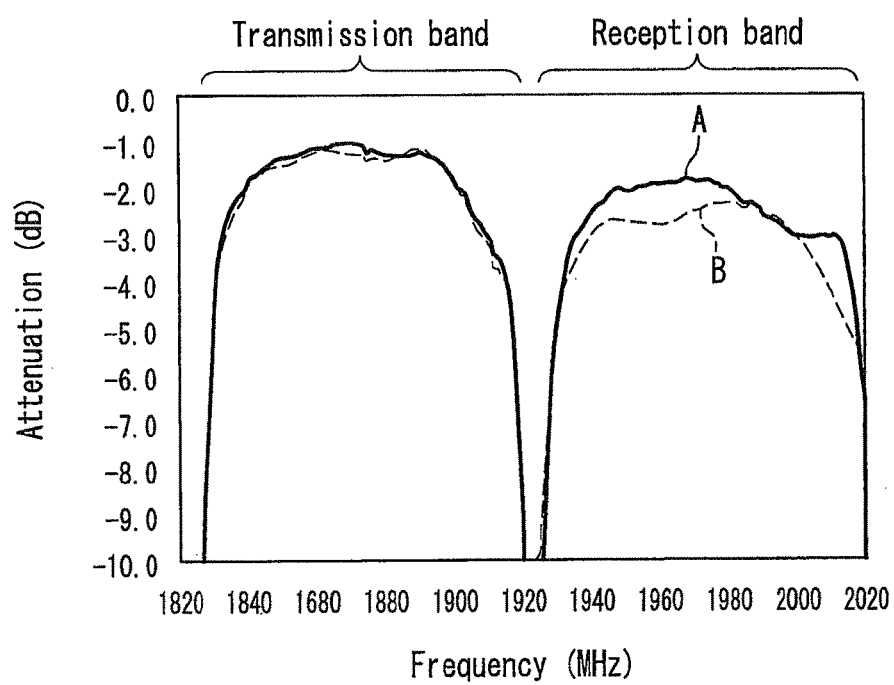
FIG. 5B is a characteristic diagram with a section Z enlarged in FIG. 5A.

FIG. 5A illustrates characteristics of the duplexer (simulation) in a PCS (Personal Communication System), and FIG. 5B is an enlarged view of a section Z (passband) in FIG. 5A. In FIGS. 5A and 5B, a characteristic A indicated by solid lines illustrates characteristics of the reception and transmission filters of a duplexer in which ladder filters are used for the reception and transmission filters, as in the present embodiment. A characteristic B indicated by dashed lines illustrates the characteristics of the reception and transmission filters of a duplexer in which a ladder filter is used for the transmission filter and a single-ended DMS filter is used for the reception filter. As illustrated in FIG. 5B, although there is not much difference between the characteristic A and characteristic B in a transmission band, the characteristic A illustrates a lower loss than the characteristic B in a reception band. That is, a low-loss duplexer can be realized when the reception filter 3 is formed of the ladder filter.

Figure 6:
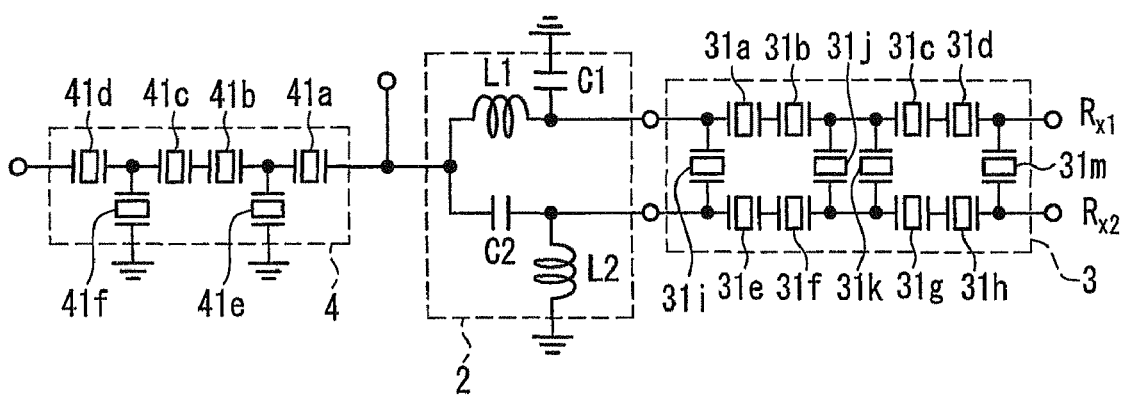
FIG. 6 is a circuit diagram illustrating a configuration of the duplexer according to Embodiment 2.

FIG. 6 is a specific circuit configuration of a duplexer that includes a reception filter formed of a balanced ladder filter. In FIG. 6, the same components as those illustrated in FIG. 1 are denoted with the same reference numerals as those therein, and the description thereof will be omitted. An antenna stage circuit 2 is disposed between the antenna terminal ANT and the reception filter 3, and composed of a LC parallel circuit. Moreover, the antenna stage circuit 2 has a function for performing phase matching between the transmission filter and the reception filter along with a function as a conversion circuit for converting a single signal into balanced signals.

The reception filter 3 is formed of a balanced ladder filter. In the reception filter 3, each of SAW filters 31$j$ and 31$k$ is connected to a node between SAW filters 31$b$ and 31$c$, and to a node between SAW filters 31$f$ and 31$g$. A SAW filter 31$i$ is connected to a node between the antenna stage circuit 2 and a SAW filter 31$a$, and to a node between the antenna stage circuit 2 and a SAW filter 31$e$. Further, a SAW filter 31$m$ is connected to a node between a SAW filter 31$d$ and the reception terminal Rx1, and to a node between a SAW filter 31$h$ and the reception terminal Rx2. With this configuration, SAW filters that are directly connected to each other such as the SAW filters 31$a$ and 31$b$ can have larger capacities, whereby power consumption per unit area can be reduced.

The transmission filter 4 is formed of a single-ended ladder filter. In the transmission filter 4, a SAW filter 41$e$ is connected to a node between SAW filters 41$a$ and 41$b$. A SAW filter 41$f$ is connected to a node between SAW filters 41$c$ and 41$d$. With this configuration, SAW filters that are directly connected to each other such as the SAW filters 41$b$ and 41$c$ can have larger capacities, whereby power consumption per unit area can be reduced.

Figure 7A:
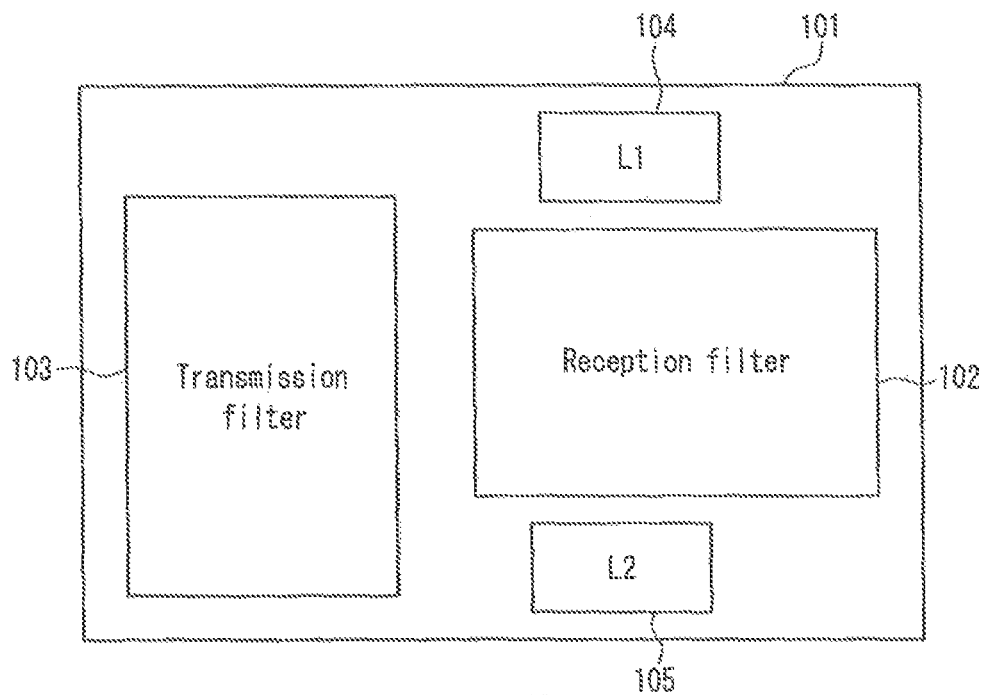
FIG. 7A is a schematic diagram illustrating a mounting image of the duplexer according to Embodiment 2.

FIG. 7A illustrates a mounting image of the duplexer illustrated in FIG. 6. In the duplexer, a reception filter chip 102 provided with the reception filter 3, a transmission filter chip 103 provided with the transmission filter 4, and inductor chips 104 and 105 provided with inductors L1 and L2 (see FIG. 6) in the antenna stage circuit 2 are mounted on a substrate 101. Although the illustrations are omitted, respective chips mounted on the substrate 101 are connected electrically to each other.

Figure 7B:
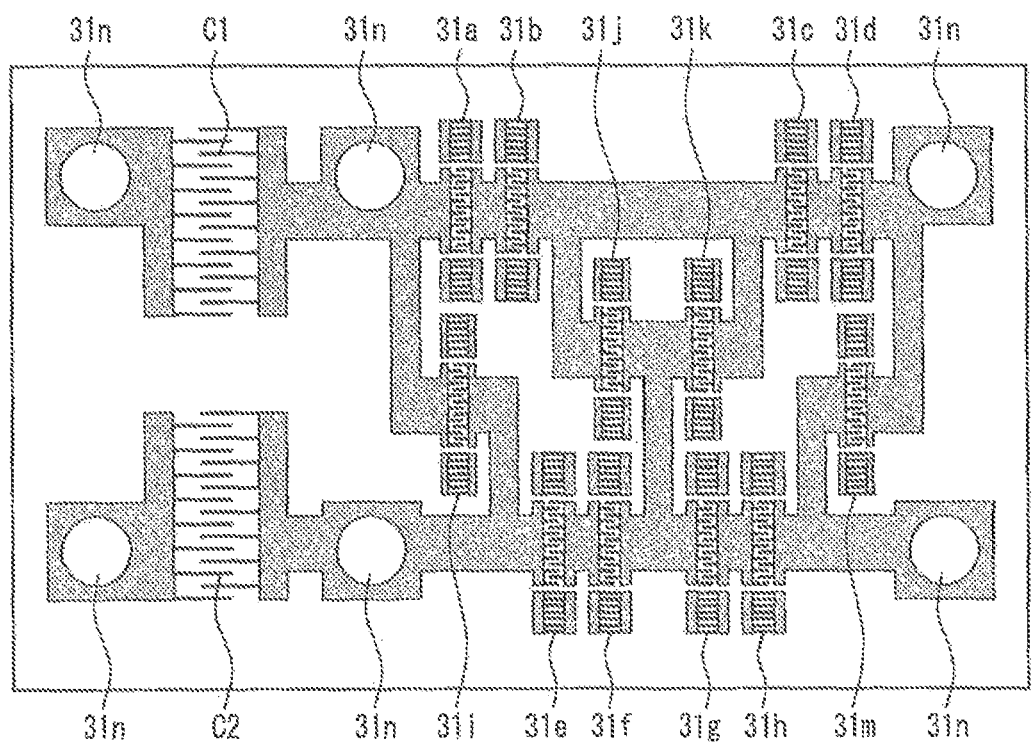
FIG. 7B is a schematic diagram illustrating a mounting image of a reception filter according to Embodiment 2.

FIG. 7B illustrates a configuration of a filter substrate in the reception filter chip 102. In a pattern illustrated in FIG. 7B, the same elements as those illustrated in FIG. 6 are denoted with the same reference numerals as those therein. As illustrated in FIG. 7B, SAW filters 31$a$ to 31$m$, capacitors C1 and C2, and connection bumps 31$n$ are formed on the filter substrate, and they are connected electrically to each other based on the electrode pattern. The capacitors C1 and C2 constituting the antenna stage circuit 2 are formed on the substrate where the filters are formed. Further, each of the SAW filters 31$a$ to 31$m$ is composed of an IDT (Interdigital Transducer: screen-shaped electrode) connected to the electrode pattern and reflectors disposed on both sides of the IDT. Note that, in the configuration illustrated in FIG. 7B, the inductors L1 and L2 further can be formed on the filter substrate.

Figure 7C:
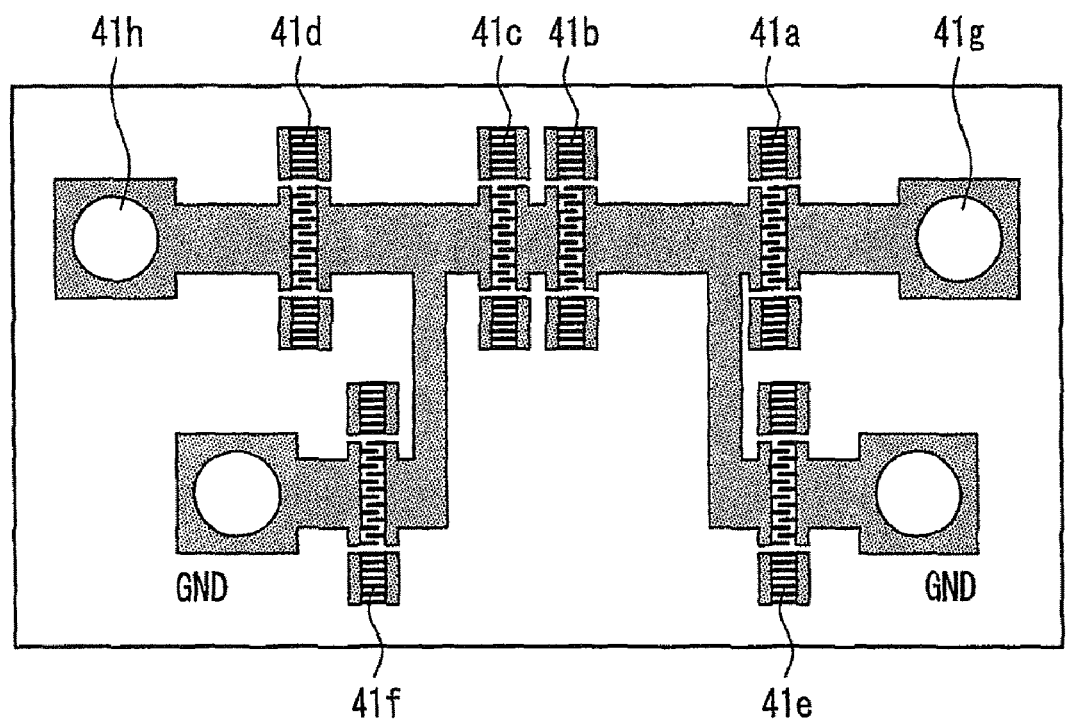
FIG. 7C is a schematic diagram illustrating a mounting image of a transmission filter according to Embodiment 2.

FIG. 7C illustrates a configuration of a filter substrate in the transmission filter chip 103. In a pattern illustrated in FIG. 7C, the same elements as those illustrated in FIG. 6 are denoted with the same reference numerals as those therein. As illustrated in FIG. 7C, SAW filters 41$a$ to 41$f$ connection bumps 41$g$ and 41$h$, and ground bumps GND are connected electrically to each other based on the electrode pattern. Further, each of the SAW filters 41$a$ to 41$f$ is composed of an IDT connected to the electrode pattern, and reflectors disposed on both sides of the IDT.

Next, specific examples of the respective circuits in the duplexer will be described.

Figure 8A:
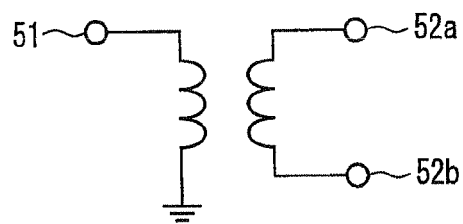
FIG. 8A is a circuit diagram illustrating an exemplary configuration of a conversion circuit.
Figure 8B:
FIG. 8B is a circuit diagram illustrating an exemplary configuration of the conversion circuit.
Figure 8C:
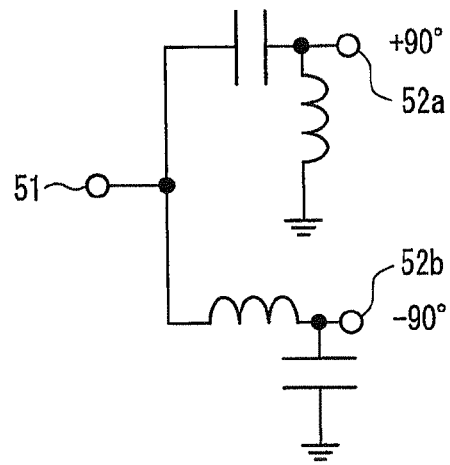
FIG. 8C is a circuit diagram illustrating an exemplary configuration of the conversion circuit.
Figure 8D:
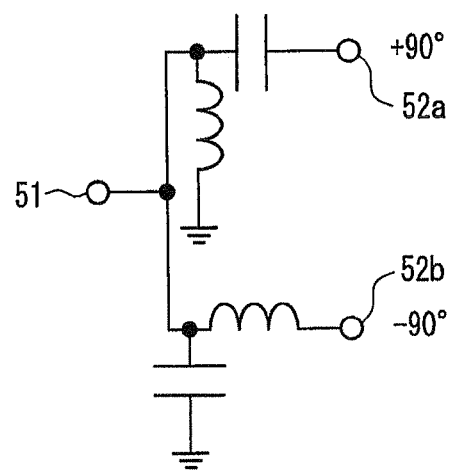
FIG. 8D is a circuit diagram illustrating an exemplary configuration of the conversion circuit.
Figure 8E:
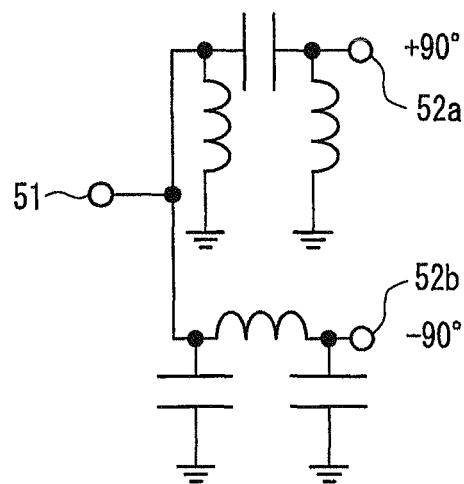
FIG. 8E is a circuit diagram illustrating an exemplary configuration of the conversion circuit.
Figure 8F:
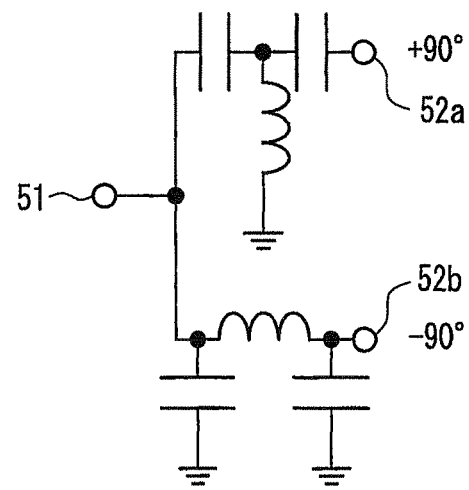
FIG. 8F is a circuit diagram illustrating an exemplary configuration of the conversion circuit.
Figure 8G:
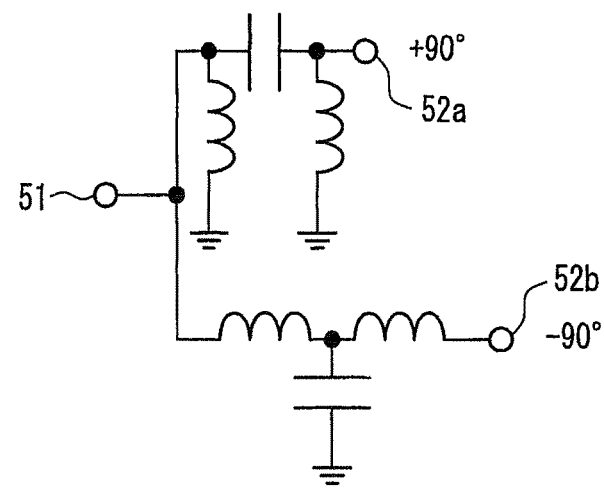
FIG. 8G is a circuit diagram illustrating an exemplary configuration of the conversion circuit.
Figure 8H:
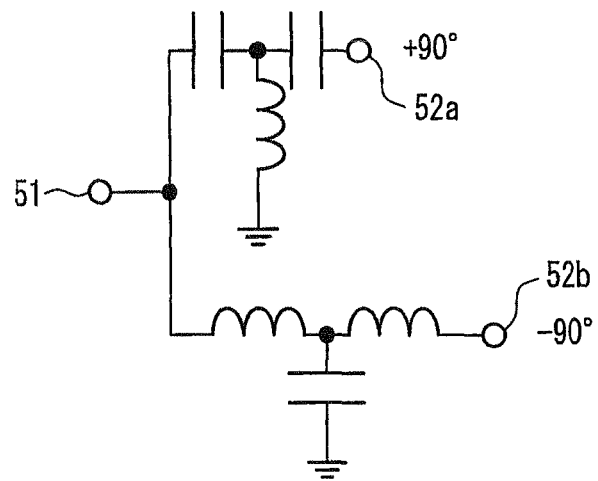
FIG. 8H is a circuit diagram illustrating an exemplary configuration of the conversion circuit.

FIGS. 8A to 8H illustrate exemplary configurations of the conversion circuit 22 formed of lumped constant elements. An input terminal 51 (single input) is a terminal that is connected to the phase matching circuit 21 and that receives a reception signal from the antenna 1. Output terminals 52$a$ and 52$b$ (balanced output) are connected to the reception filter 3. FIGS. 8A and 8B illustrate a configuration in which two inductors are used to form a trans-configuration, and a reception signal (single signal) input to the input terminal 51 is converted into balanced signals to be output from the output terminals 52$a$ and 52$b$. FIGS. 8C to 8H illustrate a configuration in which a plurality of inductors and a plurality of capacitors are combined, and a reception signal (single signal) input to the input terminal 51 is converted into balanced signals to be output from the output terminals 52$a$ and 52$b$. Note that the illustrated conversion circuits do not have much difference in properties.

Figure 9A:
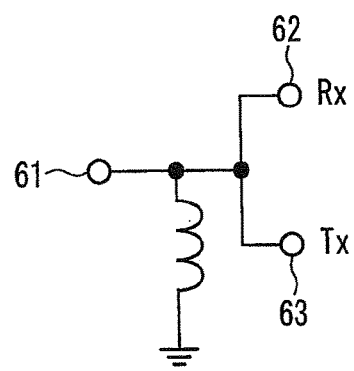
FIG. 9A is a circuit diagram illustrating an exemplary configuration of a phase matching circuit.
Figure 9B:
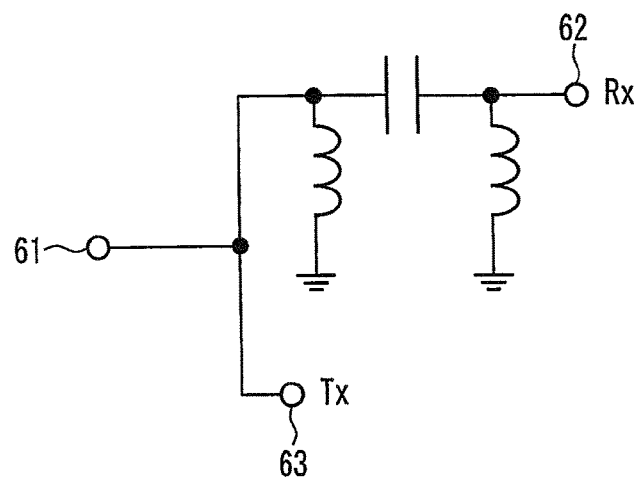
FIG. 9B is a circuit diagram illustrating an exemplary configuration of the phase matching circuit.
Figure 9C:
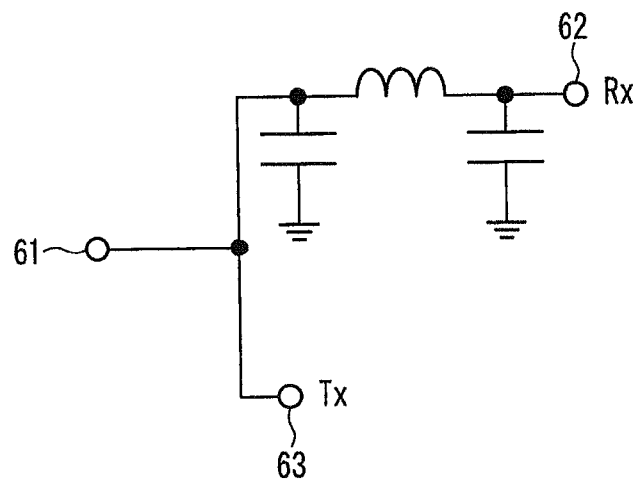
FIG. 9C is a circuit diagram illustrating an exemplary configuration of the phase matching circuit.

FIG. 9A to 9C illustrate exemplary configurations of the phase matching circuit 21 formed of lumped constant elements. A terminal 61 is connected to the antenna terminal ANT. A terminal 62 is connected to the conversion circuit 22. A terminal 63 is connected to the transmission filter 4. FIG. 9A illustrates a configuration in which an inductor is connected in parallel on the terminal 61 side. FIGS. 9B and 9C illustrate a configuration in which inductors and capacitors are connected on the terminal 62 side. Note that it is necessary to choose most suitable circuits for each of the illustrated phase matching circuits on the basis of the impedance characteristics of the reception filter and the transmission filter.

Figure 10A:
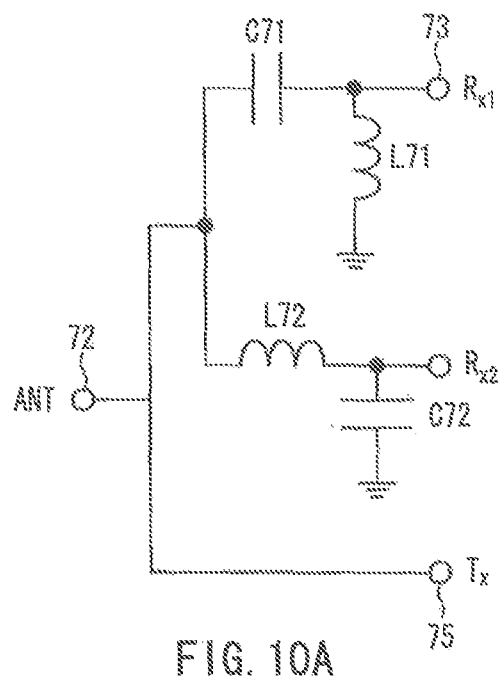
FIG. 10A is a circuit diagram illustrating an exemplary configuration of an antenna stage circuit.
Figure 10B:
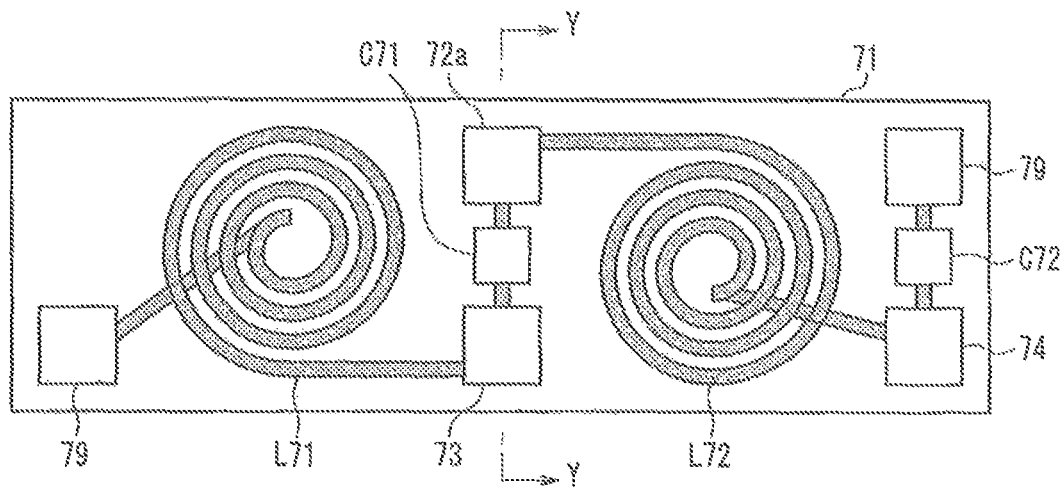
FIG. 10B is a schematic diagram illustrating a mounting image of the antenna stage circuit.
Figure 10C:
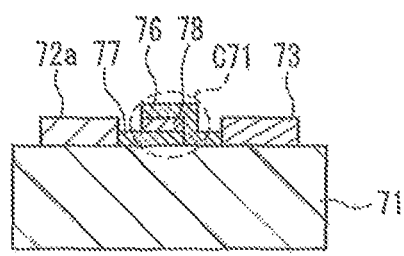
FIG. 10C is a sectional view taken along a line Y-Y in FIG. 10B.

FIG. 10A illustrates an antenna stage circuit 2 of Example 1. FIG. 10B illustrates an exemplary mounting pattern of the antenna stage circuit 2 illustrated in FIG. 10A. FIG. 10C is a sectional view taken along a line Y-Y in FIG. 10B. The same configurations in FIGS. 10A to 10C are denoted with the same reference numerals. As illustrated in FIG. 10B, the antenna stage circuit 2 includes a terminal 72$a$, a reception terminal 73 (Rx1), a reception terminal 74 (Rx2), a ground terminal 79, a series capacitor C71, a parallel capacitor C72, a parallel inductor L71, and a series inductor L72 on a substrate 71. Each of the single terminal 72$a$, the balanced terminals 73 and 74, and the ground terminal 75 is formed as a pad. The terminal 72$a$ serves not only as an antenna terminal 72 (FIG. 10A) connected to the antenna, but also as a transmission terminal 75 (FIG. 10A) connected to the transmission filter. As illustrated in FIG. 10C, the series capacitor C71 has a configuration in which a dielectric film 78 is sandwiched between an upper electrode 76 and a lower electrode 77. Although the illustration is omitted, the parallel capacitor C72 is configured in the same manner as the series capacitor C71. The parallel inductor L71 and the series inductor L72 are formed of spiral coils.

Figure 11A:
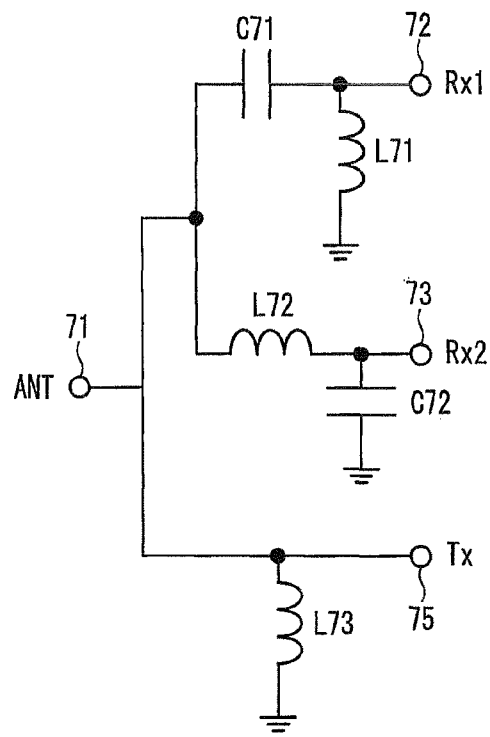
FIG. 11A is a circuit diagram illustrating an exemplary configuration of the antenna stage circuit.
Figure 11B:
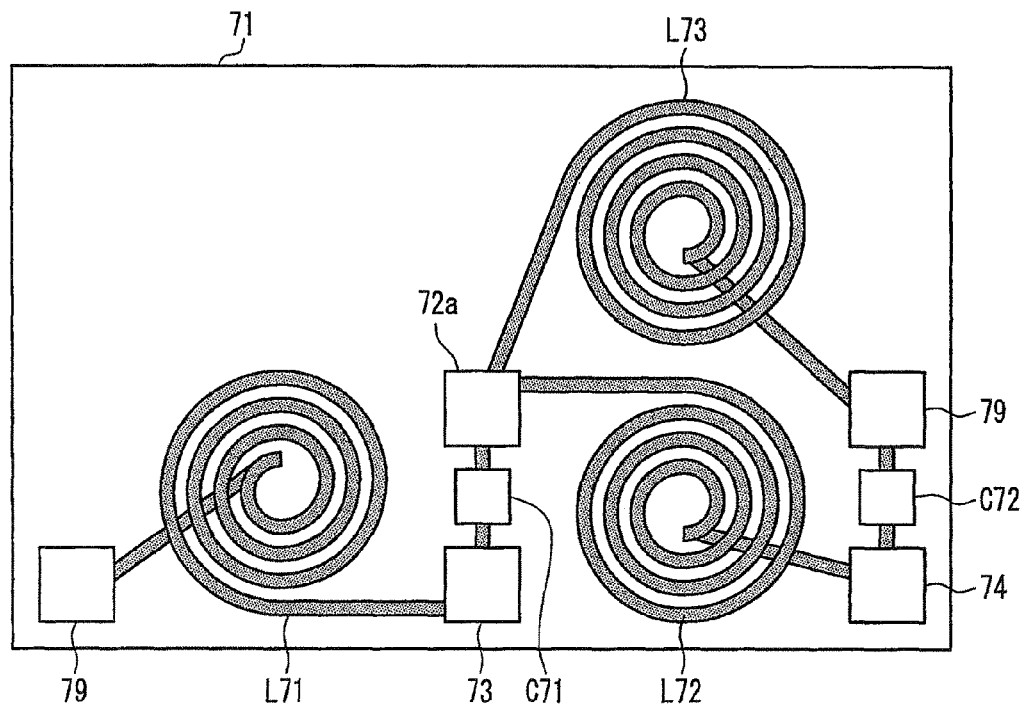
FIG. 11B is a schematic diagram illustrating a mounting image of the antenna stage circuit.

FIGS. 11A and 11B illustrate an antenna stage circuit 2 of Example 2, which is different from the antenna stage circuit 2 illustrated in FIGS. 10A and 10B in that a parallel inductor L73 is added to that of Example 1. This parallel inductor L73 is provided so as to match the impedance characteristics of the reception filter connected to the reception terminals 72, 73 to the impedance characteristics of the transmission filter connected to the transmission terminal 75. Since the configuration is identical to that illustrated in FIGS. 10A and 10B except for the parallel inductor L73, the descriptions will be omitted.

As described above, according to the present embodiment, a duplexer with a low loss and a superior power-handling capability can be realized as a result of including the conversion circuit 22 that converts single input from the antenna into balanced output, and the reception filter 3 formed of the balanced ladder filter connected to the conversion circuit 22. Note that, regarding the power-handling capability, there is no problem in practically using the DMS filter illustrated in Embodiment 1, but further improved power-handling capability can be obtained if the ladder filter illustrated in Embodiment 2 is used. The inventors of the present application examined the filters under the condition of the ambient temperature of 85° C. and input power of 1.2 W, and confirmed that the ladder filter had a lifespan 90 times or longer than that of the DMS filter.

Further, it is possible to obtain a configuration that is connectable to a balance-input-type LNA disposed downstream of the reception filter 3 as a result of using a balance-output-type reception filter 3.

Still further, a duplexer can be downsized and produced easily as a result of adopting a configuration in which the reception filter chip 102, the transmission filter chip 103, and the inductor chips 104 and 105 are mounted on the same substrate 101.

Still further, the duplexer can be downsized when each of the phase matching circuit 21 and the conversion circuit 22 is formed partially or entirely on the same filter substrate as lumped constants as illustrated in FIGS. 10B and 11B. Further, at the time of manufacturing filter chips, the phase matching circuit and the conversion circuit can be manufactured partially or entirely on the filter substrate at the same time, whereby the number of man-hours required for the production can be reduced, and accordingly, the production cost can be reduced.

Although, in the present embodiment, the balanced ladder filter is used as a filter of the balance-output type, filters having other configurations also can be used as long as they are compatible with balanced output. Hereinafter, exemplary configurations of the reception filter 3 or the transmission filter 4 will be described.

Figure 12:
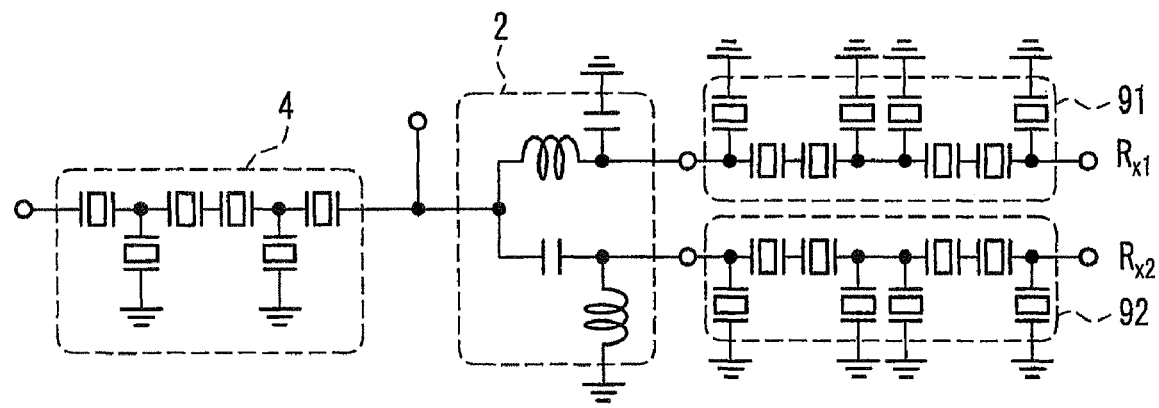
FIG. 12 is a circuit diagram illustrating another configuration of the duplexer according to Embodiment 2.

FIG. 12 illustrates a configuration of a duplexer that includes a reception filter in another form. The configuration in FIG. 12 is different from the configuration illustrated in FIG. 6 in that, instead of the reception filter 3 formed of the balanced ladder filter in FIG. 6, two reception filters, a first reception filter 91 and a second reception filter 92, formed of single-ended ladder filters are provided in FIG. 12. With this configuration, in each of the first reception filter 91 and the second reception filter 92, the constants of SAW filters can be set independently and freely, and thus, the degree of freedom in circuit design is increased. Further, also as to the configuration illustrated in FIG. 12, it is possible to realize a duplexer that is connectable to a balance-input-type LNA and that has a low loss and a superior power-handling capability.

Figure 13:
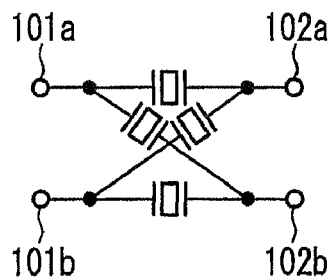
FIG. 13 is a circuit diagram illustrating a configuration of a lattice filter.

Further, as illustrated in FIG. 13, the reception filter 3 can be formed of a balanced lattice filter. The lattice filter has a gentler cut-off characteristic compared to the ladder filter. With this configuration, it is possible to realize a duplexer that is connectable to a balance-input-type LNA and that has a low loss and a superior power-handling capability.

Figure 14:
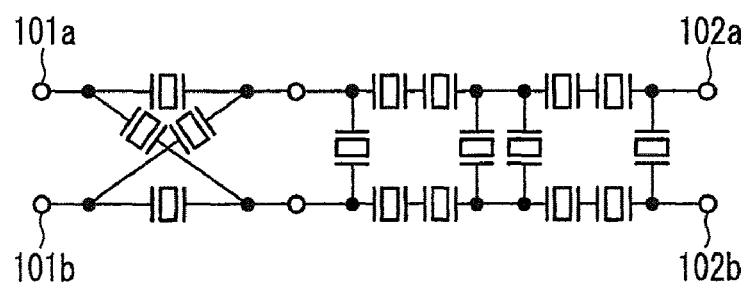
FIG. 14 is a circuit diagram illustrating a filter configuration in which the lattice filter and the ladder filter are connected to each other.

Further, as illustrated in FIG. 14, the reception filter 3 can be formed of a combination of the lattice filter and the ladder filter. With this configuration, it is possible to realize a duplexer that is connectable to a balance-input-type LNA and that has a low loss and a superior power-handling capability. In FIGS. 13 and 14, terminals 101a and 101b are connected to the output terminals of the conversion circuit 22 compatible with balanced output, and reception terminals 102a and 102b are connected to the input terminals of the LNA compatible with balanced input.

In this embodiment, the reception filter 3 and the transmission filter 4 can be realized with a plurality of the SAW filters, but the same effects can be obtained by BAW filters or boundary wave filters. The BAW filter, in which a piezoelectric film is sandwiched by electrode layers, is a filter that utilizes the resonant oscillation of the piezoelectric film and can be produced by the semiconductor technology using a silicon substrate. Examples of the BAW filter include a FBAR type and a SMR type (Solid Mounted Resonator), and the same effects can be obtained by either type. The boundary wave filter is a filter that forms a comb-shaped electrode at a boundary portion between a dielectric and a piezoelectric material closely attached to each other, and generates acoustic waves by applying signals to the electrodes. Unlike the SAW and BAW filters, the boundary wave filter does not need to have a hollow portion on its substrate, and hence, can be formed compactly.

In Embodiments 1 and 2, a part or an entirety of the phase matching circuit 21 may be formed on the same substrate on which the filter elements are formed. With this configuration, the phase matching circuit 21 and the filter elements can be formed at the same time, whereby the manufacturing process becomes easier and the production cost can be reduced. Further, the duplexer can be made compact.

Figure 15:
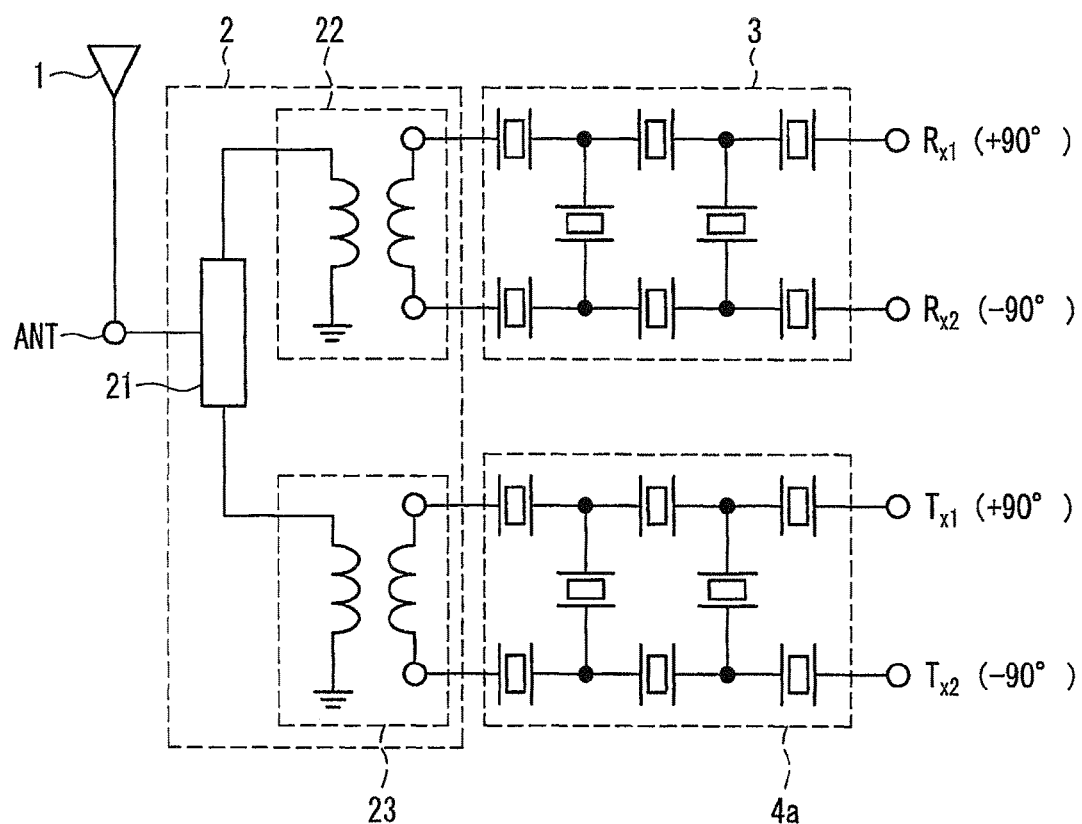
FIG. 15 is a circuit diagram illustrating another configuration of the duplexer according to Embodiment 2.

In Embodiments 1 and 2, the transmission filter 4 is formed of the single-ended ladder filter, but when the transmission filter 4a is formed of the balanced ladder filter as illustrated in FIG. 15, it is possible to obtain a configuration that is connectable to a balance-output-type power amplifier disposed upstream of the transmission filter 4. In this case, the antenna stage circuit 2 includes a conversion circuit 23 (second conversion circuit) for converting balanced transmission signals output from the transmission filter 4a into a single transmission signal. Although the illustrations are omitted, the configuration of the transmission filter 4a is not limited to the ladder filter, and may be formed of the DMS filter or lattice filter. Further, the transmission filter 4a has a configuration in which a plurality of SAW filters are connected to each other in a ladder configuration, but the BAW filter or the boundary wave filter may be used instead of the SAW filter.

Embodiment 3

Figure 16:
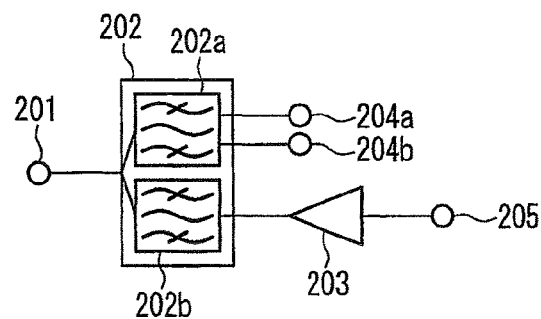
FIG. 16 is a circuit diagram illustrating a configuration of a communication module according to Embodiment 3.

FIG. 16 illustrates an exemplary communication module that includes the duplexer described in Embodiment 1 or Embodiment 2. A duplexer 202 has a reception filter 202a and a transmission filter 202b as illustrated in FIG. 16. For convenience in explanation, a conversion circuit converting single-ended input into balanced output is included in the reception filter 202a. Reception terminals 204a and 204b compatible with balanced output are connected to the reception filter 202a. A power amplifier 203 is connected to the transmission filter 202b.

At the time of the receiving operation, the reception filter 202a passes signals in a predetermined frequency band and attenuates signals in the other frequency bands among reception signals input via an antenna terminal 201, and outputs them from the reception terminals 204a and 204b to the outside. Further, at the time of the transmitting operation, the transmission filter 202b passes signals in a predetermined frequency band and attenuates signals in the other frequency bands among transmission signals input from a transmission terminal 205 and amplified by the power amplifier 203, and outputs them from the antenna terminal 201 to the outside.

As described above, according to the present embodiment, it is possible to obtain a configuration that is connectable to an LNA compatible with balanced input as a result of including the reception filter 202a formed of the balanced filter.

Further, a communication module that includes the duplexer 202 with a low loss and a superior power-handling capability can be realized as a result of forming the reception filter 202a with a ladder filter.

Note that the configuration of the communication module illustrated in FIG. 16 is merely illustrative, and a communication module in another form may be used.

Embodiment 4

Figure 17:
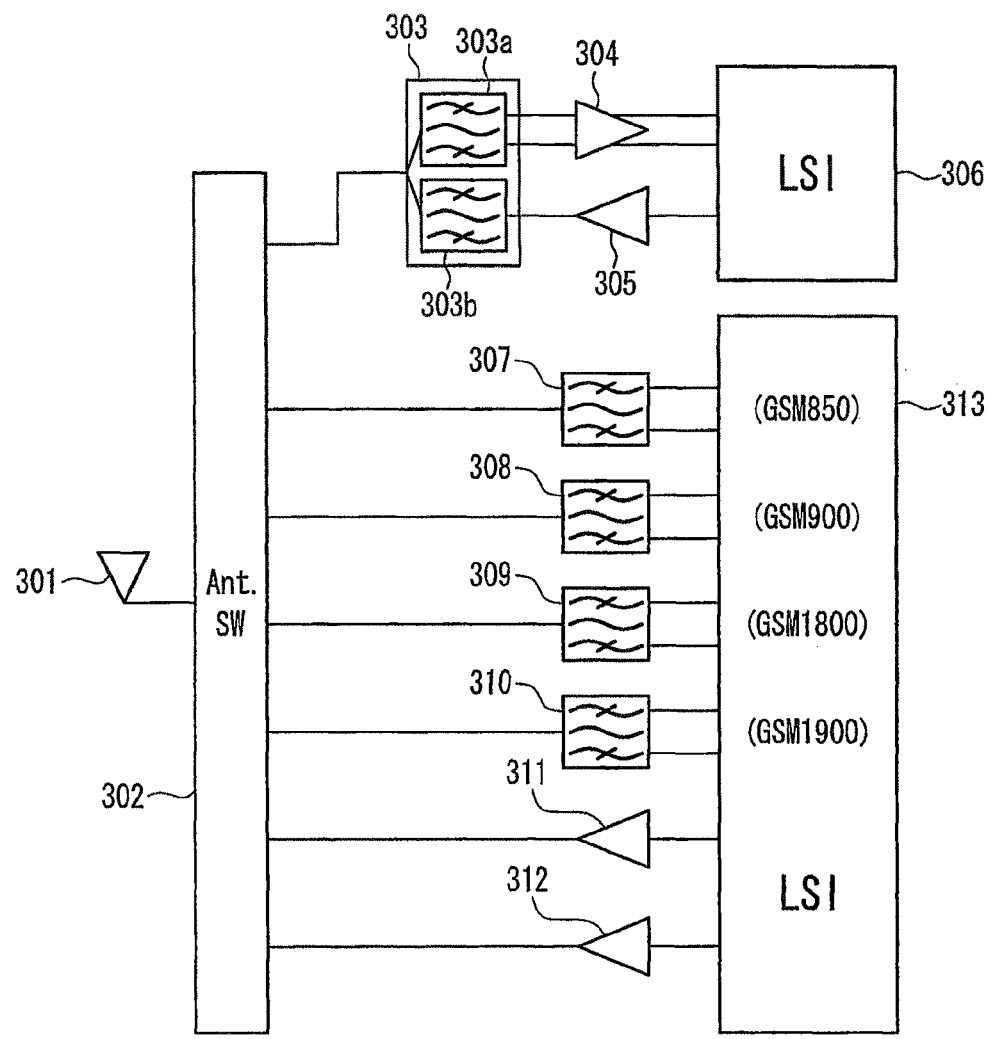
FIG. 17 is a circuit diagram illustrating a configuration of a communication device according to Embodiment 4.

FIG. 17 is an RF block of a mobile phone terminal as an exemplary communication device that includes the communication module illustrated in Embodiment 3. Further, the configuration illustrated in FIG. 17 is a configuration of a mobile phone terminal compatible with the GSM (Global System for Mobile Communications) communication system and the W-CDMA (Wideband Code Division Multiple Access) communication system. The GSM communication system in the present embodiment is compatible with the 850 MHz band, the 950 MHz band, the 1.8 GHz band, and the 1.9 GHz band. In addition to the configuration illustrated in FIG. 17, the mobile phone terminal includes a microphone, a speaker, a liquid crystal display, and the like, but the illustrations are omitted since they are not necessary to the description of the present embodiment.

First, an antenna switch circuit 302 receives a reception signal via an antenna 301 and selects an LSI that is to operate, based on whether the communication system of the reception signal is W-CDMA or GSM. If the input reception signal is compatible with the W-CDMA communication system, the antenna switch circuit 302 performs switching so that the reception signal is output to the duplexer 303. The reception signal input to the duplexer 303 is limited to a predetermined frequency band by a reception filter 303a, and the resulting balanced reception signals are output to an LNA 304. The LNA 304 amplifies the input reception signals, and outputs the amplified reception signals to an LSI 306. In the LSI 306, processing for demodulation to an audio signal is performed based on the input reception signal, and the operation of units in the mobile phone terminal is controlled.

On the other hand, in the case of transmitting a signal, the LSI 306 generates a transmission signal. The generated transmission signal is amplified by a power amplifier 305 and input to a transmission filter 303b. The transmission filter 303b passes signals in a predetermined frequency band and attenuates signals in the other frequency bands among the transmission signals input therein. The transmission filter 303b outputs the resulting transmission signal to the antenna switch circuit 302, which outputs the transmission signal to the outside via the antenna 301.

If the input reception signal is a signal compatible with the GSM communication system, the antenna switch circuit 302 selects one of the reception filters 307 to 310 in accordance with the frequency band of the input reception signal, and outputs the reception signal to the selected filter. The reception signal is band-limited by the selected one of the reception filters 307 to 310 and then input to an LSI 313. The LSI 313 performs processing for demodulation to an audio signal based on the input reception signal, and controls the operation of units in the mobile phone terminal. On the other hand, in the case of transmitting a signal, the LSI 313 generates a transmission signal. The generated transmission signal is amplified by a power amplifier 311 or 312 and then output to the antenna switch circuit 302, which outputs the transmission signal to the outside via the antenna 301.

As described above, according to the present embodiment, a communication module including the duplexer 303 with a low loss and a superior power-handling capability can be realized as a result of including the reception filter 303a formed of the balanced filters.

Note that the communication devices that can apply the duplexer of the present application or the communication module including the duplexer thereto are, for example, mobile phone terminals and PHS terminals.

The present application is useful for a duplexer compatible with balanced output. The present application further is useful for a communication module and a communication device including such a duplexer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A duplexer, comprising:
a single antenna port;
a reception filter that passes a signal in a reception frequency band and attenuates a signal in a transmission frequency band among signals input to the antenna port; and
a transmission filter that passes a signal in a transmission frequency band and attenuates a signal in a reception frequency band among signals input from an outside and outputs the filtered signal to the antenna port,
the duplexer further comprising a first conversion circuit provided with a single input terminal connected to the antenna port and balanced output terminals,
wherein the reception filter includes balanced input terminals connected to the balanced output terminals of the first conversion circuit and balanced output terminals for outputting filtered reception signals, and
the first conversion circuit is formed of lumped constant elements and has a function of performing phase matching between the reception filter and the transmission filter.

2. A communication module, comprising the duplexer according to claim 1.

3. A communication device, comprising the communication module according to claim 2.

4. The duplexer according to claim 1, wherein the reception filter is formed of a double-mode surface acoustic wave filter.

5. The duplexer according to claim 1, wherein at least a part of the reception filter is formed of a balanced ladder filter.

6. The duplexer according to claim 1, wherein the reception filter is formed of two single-ended ladder filters.

7. The duplexer according to claim 1, wherein at least a part of the reception filter is formed of a balanced lattice filter.

8. The duplexer according to claim 1, wherein the transmission filter is formed of a single-ended filter.

9. The duplexer according to claim 1,
wherein the transmission filter is formed of a balanced filter, and the duplexer further comprises a second conversion circuit,
wherein the second conversion circuit includes balanced input terminals connected to the transmission filter and a single output terminal connected to the antenna port, and converts balanced signals input to the balanced input terminals into a single signal.

10. The duplexer according to claim 9, wherein the transmission filter is formed of a balanced ladder filter or two single-ended ladder filters.

11. The duplexer according to claim 9, wherein the transmission filter is formed of a double-mode surface acoustic wave filter.

12. The duplexer according to claim 1, wherein the first conversion circuit with the phase matching function is formed on a same substrate.

13. The duplexer according to claim 1, wherein each of the first conversion circuit with the phase matching function is formed partially or entirely on a substrate of a transmission filter element or a reception filter element.

14. The duplexer according to claim 1, wherein the reception filter or the transmission filter includes a plurality of filter elements, and
the filter elements are composed of any one of a surface acoustic wave filter, a boundary wave filter, or a film bulk acoustic resonator filter.

* * * * *